United States Patent
Jang et al.

(10) Patent No.: US 9,202,540 B1
(45) Date of Patent: Dec. 1, 2015

(54) SEMICONDUCTOR MEMORY DEVICE AND METHOD FOR OPERATING THE SAME

(71) Applicant: SK hynix Inc., Gyeonggi-do (KR)

(72) Inventors: Soo-Young Jang, Gyeonggi-do (KR); Hyun-Woo Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/558,304

(22) Filed: Dec. 2, 2014

(30) Foreign Application Priority Data

Jun. 30, 2014 (KR) .................. 10-2014-0080926

(51) Int. Cl.
| | |
|---|---|
| *G11C 7/00* | (2006.01) |
| *G11C 7/12* | (2006.01) |
| *G11C 11/4094* | (2006.01) |
| *G11C 11/4091* | (2006.01) |
| *G11C 7/10* | (2006.01) |

(52) U.S. Cl.
CPC ............... *G11C 7/12* (2013.01); *G11C 7/1048* (2013.01); *G11C 11/4091* (2013.01); *G11C 11/4094* (2013.01)

(58) Field of Classification Search
CPC ......................................................... G11C 7/12
USPC ......................................................... 365/203
See application file for complete search history.

(56) References Cited

U.S. PATENT DOCUMENTS 6,005,826 A * 12/1999 Ahn .................. G11C 8/18
365/203

FOREIGN PATENT DOCUMENTS

KR 1020020042393 6/2002

* cited by examiner

*Primary Examiner* — Son Mai
(74) *Attorney, Agent, or Firm* — IP & T Group LLP

(57) ABSTRACT

A semiconductor memory device includes an active state detector suitable for detecting whether or not a predetermined time passes after a moment when a normal active command or an additional active pulse is activated in an active state detection mode, and generating an additional precharge pulse based on a detection result, a column controller suitable for generating the additional active pulse based on the additional precharge pulse, a column address, and an external column command in the active state detection mode, and a core region suitable for being activated based on the normal active command or an additional active command corresponding to the additional active pulse, and being precharged based on an additional precharge command corresponding to the additional precharge pulse or a normal precharge command.

20 Claims, 3 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2014-0080926, filed on Jun. 30, 2014, which is incorporated herein by reference in its entirety.

BACKGROUND

1. Field

Various embodiments of the present invention relate to a semiconductor designing technology, and more particularly, to an active-precharge operation control of a semiconductor memory device.

2. Description of the Related Art

Semiconductor memory devices may store a plurality of data and provide data that is requested. That is, a semiconductor memory device may perform a data write operation for storing data received from an outside of the semiconductor memory device and a data read operation for outputting a data stored in the semiconductor memory device to the outside.

When data is stored in a memory cell of a semiconductor memory device, which is a unit for storing data, particularly, a dynamic random access memory (DRAM), or when data stored in a memory cell of the semiconductor memory device is outputted to the outside, several operations, such as an active operation, a write/read operation, and a precharge operation, have to be performed.

An active operation and a write operation are performed to select a designated memory cell among a plurality of memory cells in a DRAM and to store the data in the selected memory cell. In addition, an active operation and a read operation are performed to select a designated memory cell among a plurality of memory cells in a DRAM and output the data stored in the selected memory cell. A precharge operation is performed to return the DRAM to a state before the active operation is performed.

FIG. 1 is a block diagram illustrating a conventional semiconductor memory device.

Referring to FIG. 1, the semiconductor memory device includes a core region 100, an active controller 110, a column controller 120, and an address decoder 160.

The active controller 110 generates a normal active command NM_ACT in response to an external active command EX_ACT and a row address ROW_ADD, and generates a normal precharge command NM_PCG in response to an external precharge command EX_PCG and the row address ROW_ADD.

The column controller 120 generates a normal column command NM_RD/WT in response to an external column command EX_RD/WT and a column address COLUMN_ADD. The external column command EX_RD/WT may be a read command or a write command.

The address decoder 160 generates the row address ROW_ADD and the column address COLUMN_ADD in response to an external address EX_ADD.

The core region 100 is activated in response to the normal active command NM_ACT, precharged in response to the normal precharge command NM_PCG, and performs a column operation of inputting/outputting data in response to the normal column command NM_RD/WT.

As described above, the semiconductor memory device activates the core region 100 in response to the external active command EX_ACT applied from the outside, and precharges the core region 100 in response to the external precharge command EX_PCG applied from the outside. In short, the conventional semiconductor memory device depends on the external commands EX_ACT and EX_PCG inputted from the outside to perform an active-precharge operation.

A section from an application of the external active command EX_ACT to an application of the external precharge command EX_PCG may last longer than a predetermined time ($tRAS_{max}$), which is set for the semiconductor memory device.

When the core region 100 keeps the active state even after the predetermined time passes, current consumption of the semiconductor memory device may be increased unnecessarily and an erroneous operation may be caused.

SUMMARY

Various embodiments of the present invention are directed to a semiconductor memory device capable of detecting whether an active state of a core region lasts after a predetermined time and precharging the core region before an external precharge command is applied.

In accordance with an embodiment of the present invention, a semiconductor memory device may include: an active state detector suitable for detecting whether or not a predetermined time passes after a moment when a normal active command or an additional active pulse is activated in an active state detection mode, and generating an additional precharge pulse based on a detection result; a column controller suitable for generating the additional active pulse based on the additional precharge pulse, a column address, and an external column command in the active state detection mode; and a core region suitable for being activated based on the normal active command or an additional active command corresponding to the additional active pulse, and being precharged based on an additional precharge command corresponding to the additional precharge pulse or a normal precharge command.

The semiconductor memory device may further include: a first active controller suitable for generating the normal active command based on an external active command and a row address, and generating the normal precharge command based on an external precharge command and the row address; and a second active controller suitable for generating the additional active command based on the additional active pulse and the row address, and generating the additional precharge command based on the additional precharge pulse and the row address.

The active state detector may include: an oscillation unit for generating an oscillation signal that toggles at a predetermined frequency in the active state detection mode; an active measurement unit for counting the number of times that the oscillation signal toggles after a moment when the normal active command or the additional active pulse is activated in the active state detection mode, and outputting the counted number as a measurement signal; and a pulse generation unit for selectively activating the additional precharge pulse when a value of the measurement signal is greater than a predetermined value.

The active measurement unit may initialize a value of the measurement signal when the normal active command is activated or the external column command is applied, in the active state detection mode.

The pulse generation unit may activate the additional precharge pulse, when a value of the measurement signal is greater than the predetermined value in the active state detection mode, and the pulse generation unit does not activate the additional precharge pulse, when a value of the measurement signal is equal to or less than the predetermined value in the active state detection mode.

The column controller may activate the additional active pulse when the external column command and the column address are applied when the additional precharge pulse is activated, and the column controller does not activate the additional active pulse regardless of whether the external column command and the column address are applied when the additional precharge pulse is not activated.

The column controller may activate a normal column command when the external column command and the column address are applied, regardless of the active state detection mode.

The column controller may activate the normal column command when a predetermined time passes after a moment when the additional active pulse is activated when the external column command and the column address are applied, and the additional precharge pulse is activated.

The core region may perform a column operation for inputting/outputting data based on the normal column command.

In accordance with an embodiment of the present invention, a method for operating a semiconductor memory device may include: detecting whether or not a predetermined time passes after a moment when a normal active command is activated in an active detection mode to produce a first detection result; and internally generating an additional precharge pulse based on the first detection result.

The method for operating a semiconductor memory device may further include: generating an additional active pulse based on an external column command and a column address, when the additional precharge pulse is activated; detecting whether or not the predetermined time passes after a moment when the additional active pulse is activated to produce a second detection result, and generating the additional precharge pulse based on the second detection result; generating the additional active pulse based on the external column command and the column address, when the additional precharge pulse is activated; and activating a core region based on the normal active command or an additional active command corresponding to the additional active pulse, and precharging the core region based on a normal precharge command or an additional precharge command corresponding to the additional precharge pulse.

The method for operating a semiconductor memory device may further include: generating the normal active command based on an external active command and a row address; generating the normal precharge command based on an external precharge command and the row address; generating the additional active command based on the additional active pulse and the row address; and generating the additional precharge command based on the additional precharge pulse and the row address.

The method for operating a semiconductor memory device may further include: generating an oscillation signal that toggles at a predetermined frequency in the active state detection mode.

The detecting of whether or not the predetermined time passes to produce the first detection result may include: counting the number of times that the oscillation signal toggles after the moment when the normal active command is activated in the active state detection mode, and outputting the counted number as a measurement signal.

The internally generating of the additional precharge pulse may include: selectively activating the additional precharge pulse when a value of the measurement signal is greater than a predetermined value.

The generating of the additional active pulse may include: activating the additional active pulse based on the external column command and the column address, when the additional precharge pulse is activated; and not activating the additional active pulse regardless of the external column command and the column address, when the additional precharge pulse is not activated.

The detecting of whether or not the predetermined time passes to produce the second detection result may include: counting the number of times that the oscillation signal toggles after the moment when the additional active pulse is activated and outputting the counted number as the measurement signal; and selectively activating the additional precharge pulse when a value of the measurement signal is greater than a predetermined value.

The generating of the additional active pulse may include: activating the additional active pulse based on the external column command and the column address, when the additional precharge pulse is activated; and not activating the additional active pulse regardless of the external column command and the column address, when the additional precharge pulse is not activated.

The value of the measurement signal may be initialized when the normal active command is activated or the external column command is applied, in the active state detection mode.

The method for operating a semiconductor memory device may further include: generating a normal column command based on the external column command and the column address, regardless of the active state detection mode.

DETAILED DESCRIPTION

Figure 1:
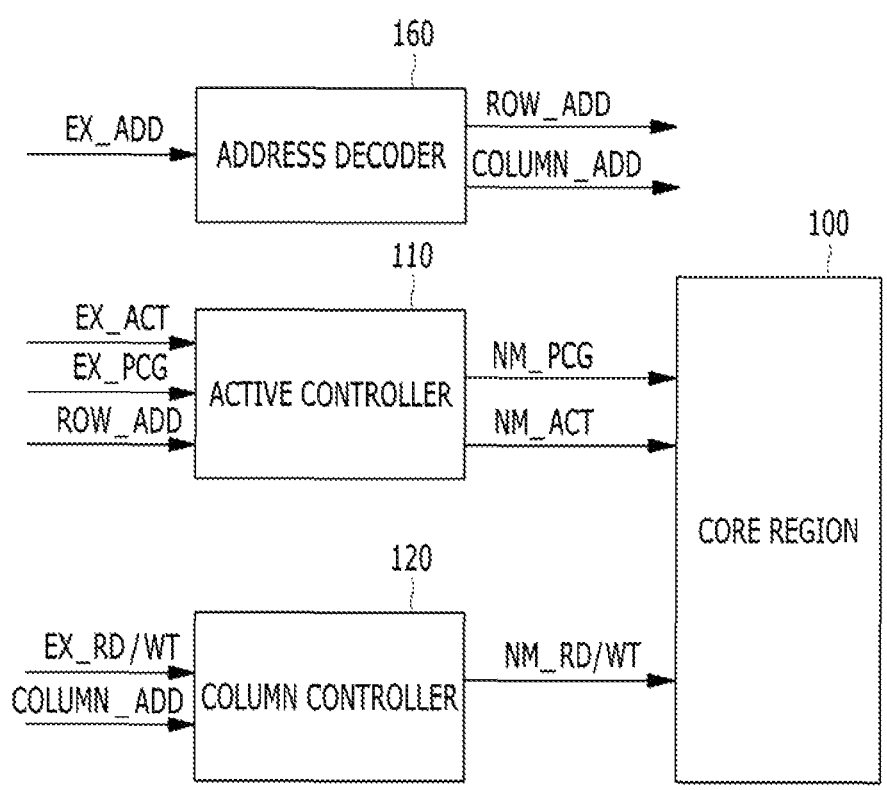
FIG. 1 is a block diagram illustrating a conventional semiconductor memory device.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. In this specification, specific terms have been used. The terms are used to describe the present invention, and are not used to qualify the sense or limit the scope of the present invention.

It is also noted that in this specification, "and/or" represents that one or more of components arranged before and after "and/or" is included. Furthermore, "connected/coupled" refers to one component not only directly coupling another component but also indirectly coupling another component through an intermediate component. In addition, a singular form may include a plural form as long as it is not specifically mentioned in a sentence. Furthermore, "include/comprise" or "including/comprising" used in the specification represents that one or more components, steps, operations, and elements exist or are added.

Figure 2:
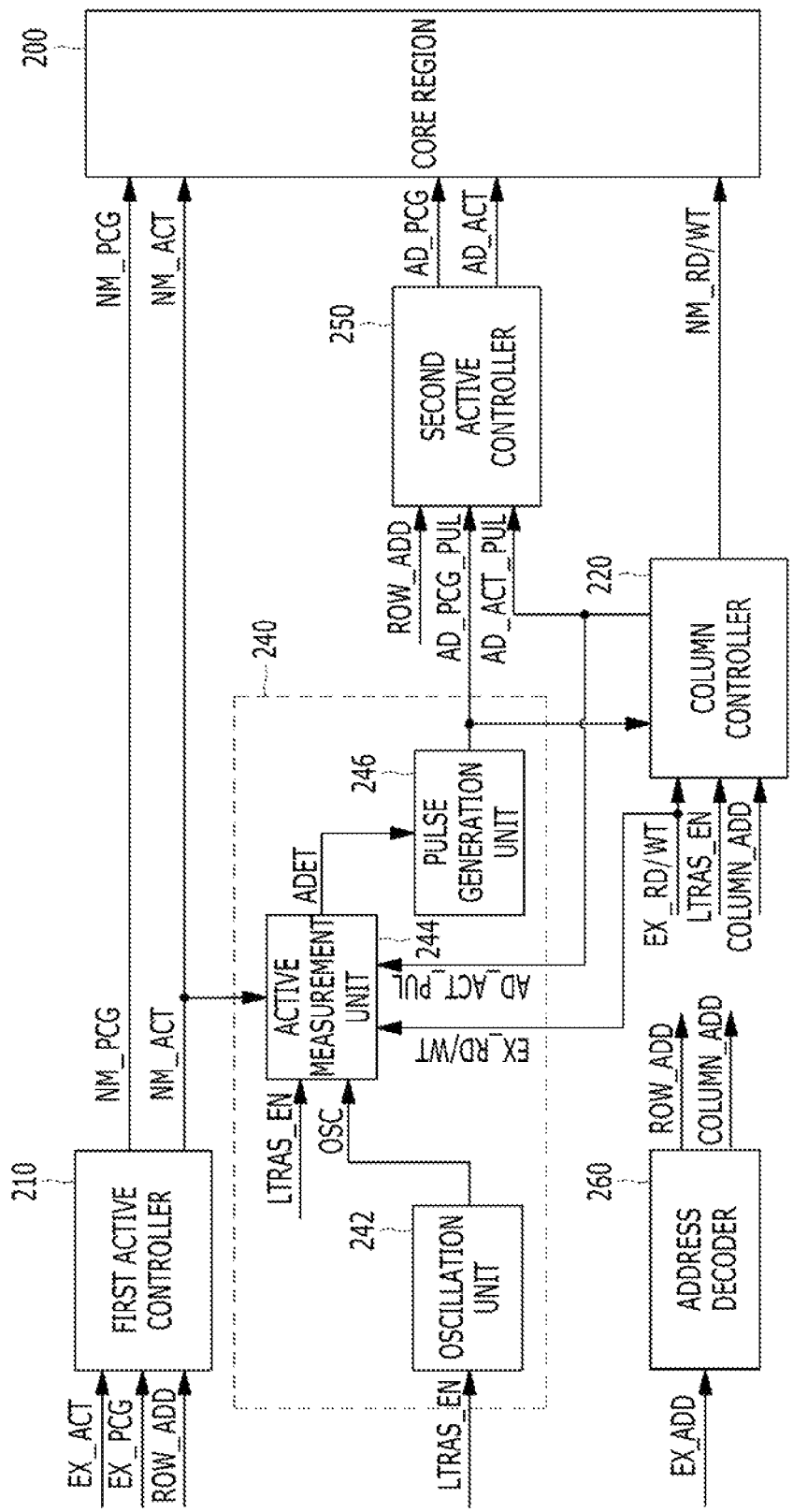
FIG. 2 is a block diagram Illustrating a semiconductor memory device supporting an active-precharge operation in accordance with an embodiment of the present invention.

FIG. 2 is a block diagram illustrating a semiconductor memory device supporting an active-precharge operation in accordance with an embodiment of the present invention.

Referring to FIG. 2, the semiconductor memory device may include a core region 200, a first active controller 210, a column controller 220, an active state detector 240, and a second active controller 250, and an address decoder 260. The active state detector 240 may include an oscillation unit 242, an active measurement unit 244, and a pulse generation unit 246.

The core region 200 is activated in response to a normal active command NM_ACT and an additional active command AD_ACT corresponding to an additional active pulse AD_ACT_PUL, and the core region 200 is precharged in response to a normal precharge command NM_PCG and an additional precharge command AD_PCG corresponding to an additional precharge pulse AD_PCG_PUL. Additionally, the core region 200 performs a column operation of inputting/outputting data in response to a normal column command NM_RD/WT.

The first active controller 210 generates the normal active command NM_ACT in response to an external active command EX_ACT and a row address ROW_ADD, and generates the normal precharge command NM_PCG in response to an external precharge command EX_PCG.

The second active controller 250 generates the additional active command AD_ACT in response to the additional active pulse AD_ACT_PUL and the row address ROW_ADD, and generates the additional precharge command AD_PCG in response to the additional precharge pulse AD_PCG_PUL and the row address ROW_ADD.

The address decoder 260 generates the row address ROW_ADD and a column address COLUMN_ADD in response to an external address EX_ADD.

The active state detector 240 detects whether a predetermined time, for example, $tRAS_{max}$, passes after a moment when the normal active command NM_ACT or the additional active pulse AD_ACT_PUL is activated, in an active state detection mode. The active state detector 240 may be enabled when an active state detection mode signal LTRAS_EN is activated.

Specifically, the active state detector 240 activates the additional precharge pulse AD_PCG_PUL in the active state detection mode, when the predetermined time passes after a moment when the normal active command NM_ACT or the additional active pulse AD_ACT_PUL is activated. When the predetermined time passes after the moment when the normal active command NM_ACT or the additional active pulse AD_ACT_PUL is activated in the active state detection mode, it means that the external column command EX_RD/WT or the external precharge command EX_PCG is not applied within the predetermined time after the external active command EX_ACT is applied from an external memory controller (not Illustrated). That is, the core region 200 remains in the active state without performing any operation. Therefore, the active state detector 240 generates the additional precharge pulse AD_PCG_PUL to switch the core region 200 from the active state into a precharge state.

Conversely, when the predetermined time has not passed after the moment when the normal active command NM_ACT or the additional active pulse AD_ACT_PUL is activated in the active state detection mode, the active state detector 240 deactivates the additional precharge pulse AD_PCG_PUL. When the predetermined time has not passed after the moment when the normal active command NM_ACT or the additional active pulse AD_ACT_PUL is activated in the active state detection mode, it means that the external column command EX_RD/WT or the external precharge command EX_PCG is applied within the predetermined time after the external active command EX_ACT is applied from the external memory controller. That is, an operation of inputting/outputting data is performed on the core region 200, or an operation of precharging the core region 200 is performed. Therefore, the active state detector 240 does not need to activate the additional precharge pulse AD_PCG_PUL.

The column controller 220 generates the additional active pulse AD_ACT_PUL in response to the external column command EX_RD/WT, the column address COLUMN_ADD, and the additional precharge pulse AD_PCG_PUL.

Specifically, the column controller 220 activates the additional active pulse AD_ACT_PUL in response to the external column command EX_RD/WT and the column address COLUMN_ADD, when the additional precharge pulse AD_PCG_PUL is activated. The additional precharge pulse AD_PCG_PUL is internally generated by the active state detector 240 regardless of the external memory controller. That is, the external memory controller recognizes that the core region 200 remains in the active state since the external memory controller does not apply the external precharge command EX_PCG after an application of the external active command EX_ACT. Therefore, the external memory controller may try to transmit the external column command EX_RD/WT or the external precharge command EX_PCG in the next step. The application of the external column command EX_RD/WT means that a column operation of inputting/outputting data is to be performed on the core region 200. Thus, the core region 200 that is precharged by the active state detector 240, needs to be activated again. Therefore, the column controller 220 activates the additional active pulse AD_ACT_PUL to switch the core region 200 from the precharge state into the active state, when the external column command EX_RD/WT and the column address COLUMN_ADD are applied.

Conversely, when the active state detector 240 does not activate the additional precharge pulse AD_PCG_PUL, the column controller 220 does not activate the additional active pulse AD_ACT_PUL, regardless of the external column command EX_RD/WT and the column address COLUMN_ADD. Since the active state detector 240 does not activate the additional precharge pulse AD_PCG_PUL, means that the core region 200 is not precharged after the core region 200 is activated in response to the external active command EX_ACT.

The oscillation unit 242 generates an oscillation signal OSC that toggles at a predetermined frequency in the active state detection mode. That is, the oscillation unit 242 toggles the oscillation signal OSC at the predetermined frequency in the active state detection mode, and does not toggle the oscillation signal OSC outside the active state detection mode.

The active measurement unit 244 counts the number of times that the oscillation signal OSC toggles after the moment when the normal active command NM_ACT or the additional active pulse AD_ACT_PUL is activated in the active state detection mode, to generate a measurement signal ADET. The active measurement unit 244 initializes a value of the measurement signal ADET when the normal active command NM_ACT or the external column command EX_RD/WT is activated in the active state detection mode.

The pulse generation unit 246 selectively generates the additional precharge pulse AD_PCG_PUL based on whether or not a value of the measurement signal ADET, that is, a counted value, is greater than a predetermined value. Specifically, the pulse generation unit 246 activates the additional precharge pulse AD_PCG_PUL, when a value of the measurement signal ADET is greater than the predetermined value. On the contrary, when a value of the measurement signal ADET is equal to or less than the predetermined value, the pulse generation unit 246 does not activate the additional precharge pulse AD_PCG_PUL.

The column controller 220 always activates the normal column command NM_RD/WT when the external column command EX_RD/WT and the column address COLUMN_ADD are applied, regardless of the active state detection mode.

Therefore, the column controller 220 generates the additional active pulse AD_ACT_PUL and the normal column command NM_RD/WT in response to the external column command EX_RD/WT and the column address COLUMN_ADD, when the additional precharge pulse AD_PCG_PUL is activated in the active state detection mode. The column controller 220 activates the normal column command NM_RD/WT when a predetermined time passes after the moment when the additional active pulse AD_ACT_PUL is activated. The column operation may be normally performed only when the normal column command NM_RD/WT is transmitted to the core region 200 after the core region 200 is activated in response to the additional active command AD_ACT corresponding to the additional active pulse AD_ACT_PUL.

Furthermore, when the additional precharge pulse AD_PCG_PUL is not activated in the active state detection mode, the column controller 220 generates the normal column command NM_RD/WT based on the external column command EX_RD/WT and the column address COLUMN_ADD.

In addition, the column controller 220 generates the normal column command NM_RD/WT based on the external column command EX_RD/WT and the column address COLUMN_ADD, outside the active state detection mode.

Entering the active state detection mode is determined based on the active state detection mode signal LTRAS_EN. For example, a section in which the active state detection mode signal LTRAS_EN is activated, is the active state detection mode. The active state detection mode signal LTRAS_EN is deactivated outside the active state detection mode. Moreover, the active state detection mode signal LTRAS_EN may be generated in a setting circuit included in the semiconductor memory device, such as a mode register set (MRS).

Figure 3:
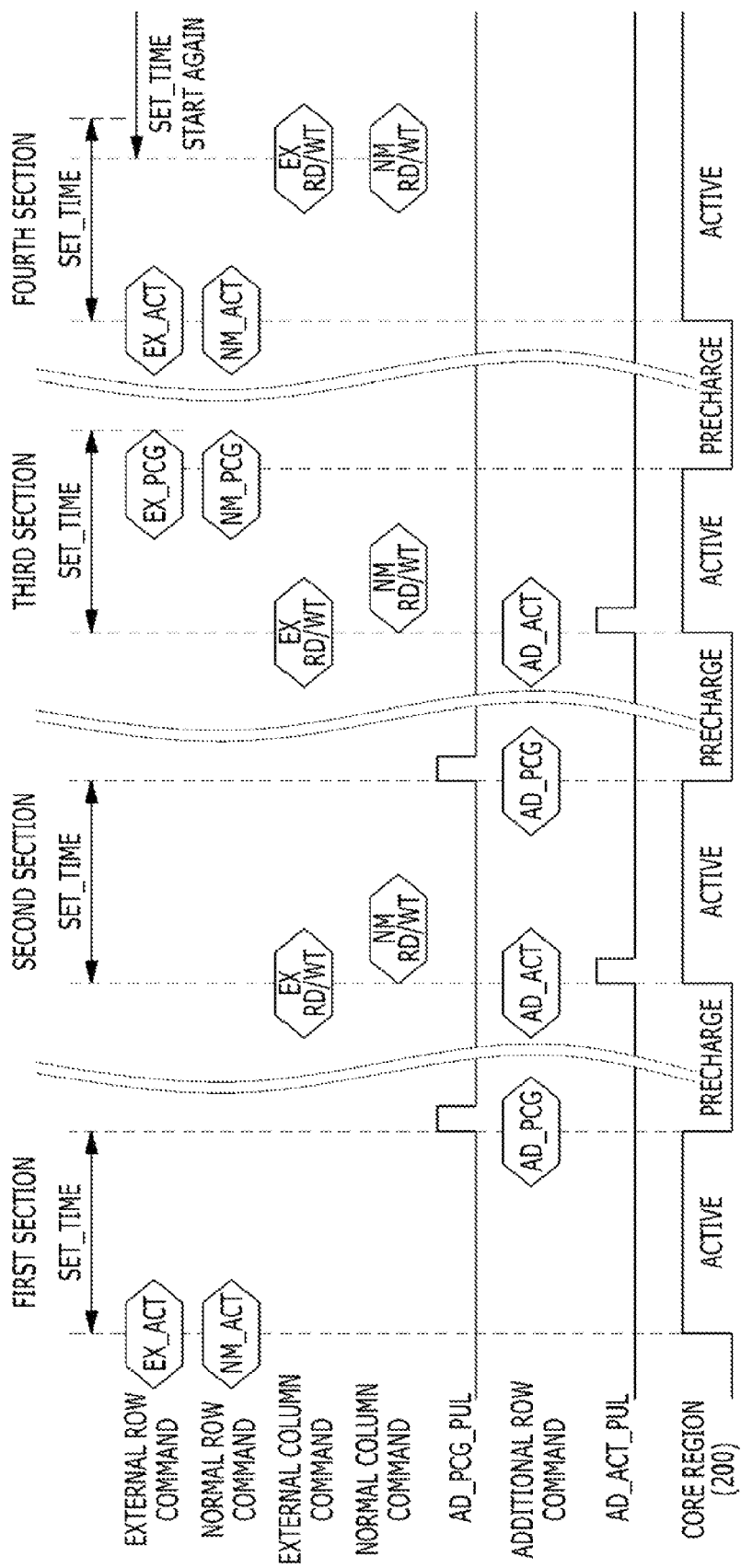
FIG. 3 is a timing diagram for describing an operation of the semiconductor memory device shown in FIG. 2.

FIG. 3 is a timing diagram for describing an operation of the semiconductor memory device shown in FIG. 2.

Referring to FIG. 3, when the external precharge command EX_PCG is not applied within a predetermined time SET_TIME, for example, $tRAS_{max}$, from a moment when the normal active command NM_ACT or the additional active pulse AD_ACT_PUL is activated in the active state detection mode, the additional precharge pulse AD_PCG_PUL is activated to precharge the core region 200.

Specifically, when the external active command EX_ACT is applied and thus the normal active command NM_ACT is activated, the state of the core region 200 is switched into the active state. It is detected whether or not the predetermined time SET_TIME passes after the moment when the normal active command NM_ACT is activated, and based on the detection result, the additional precharge pulse AD_PCG_PUL is generated.

In "a first section", the normal column command NM_RD/WT or the normal precharge command NM_PCG is not generated until the predetermined time SET_TIME passes after a moment when the normal active command NM_ACT is activated. Therefore, the additional precharge pulse AD_PCG_PUL is activated, and thus the additional precharge command AD_PCG is activated based on the additional precharge pulse AD_PCG_PUL. Accordingly, the state of the core region 200 is switched into the precharge state.

When the state of the core region 200 is switched into the precharge state by activating the additional precharge pulse AD_PCG_PUL as shown in the "first section", the additional active pulse AD_ACT_PUL is activated in response to the column address COLUMN_ADD and the external column command EX_RD/WT to be applied as shown at the beginning point of "a second section", and then the additional active command AD_ACT is activated based on the additional active pulse AD_ACT_PUL. Thus, the state of the core region 200 is switched into the active state. Moreover, the normal column command NM_RD/WT is activated in response to the external column command EX_RD/WT and the column address COLUMN_ADD. Specifically, when the additional precharge pulse AD_PCG_PUL is activated, both of the additional active pulse AD_ACT_PUL and the normal column command NM_RD/WT may be activated in response to the external column command EX_RD/WT and the column address COLUMN_ADD. The normal column command NM_RD/WT is activated when a predetermined time SET_TIME passes after the moment when the additional active pulse AD_ACT_PUL is activated. The column operation may be performed normally in the core region 200 when the normal column command NM_RD/WT is activated after the core region 200 enters the active state.

Furthermore, when the additional active command AD_ACT is activated based on the additional active pulse AD_ACT_PUL, the state of the core region 200 is switched into the active state. It is detected whether or not the predetermined time SET_TIME passes after the moment when the additional active command AD_ACT is activated, and based on the detection result, the additional precharge pulse AD_PCG_PUL is generated.

In "a second section", the normal column command NM_RD/WT or the normal precharge command NM_PCG is not activated until the predetermined time SET_TIME passes after a moment when the additional active command AD_ACT is activated. Therefore, the additional precharge pulse AD_PCG_PUL is activated, and thus the additional precharge command AD_PCG is activated based on the additional precharge pulse AD_PCG_PUL. Accordingly, the state of the core region 200 is switched into the precharge state.

When the state of the core region 200 is switched into the precharge state by activating the additional precharge pulse AD_PCG_PUL as shown in the "second section", the additional active pulse AD_ACT_PUL is activated in response to the column address COLUMN_ADD and the external column command EX_RD/WT as shown at the beginning point of "a third section", and then the additional active command AD_ACT is activated based on the additional active pulse AD_ACT_PUL. Thus, the state of the core region 200 is switched into the active state. Furthermore, the normal column command NM_RD/WT may be activated in response to the external column command EX_RD/WT and the column address COLUMN_ADD. Specifically, when the additional precharge pulse AD_PCG_PUL is activated, both of the additional active pulse AD_ACT_PUL and the normal column command NM_RD/WT may be activated in response to the external column command EX_RD/WT and the column address COLUMN_ADD. The normal column command NM_RD/WT is activated when a predetermined time passes after the moment when the additional active pulse AD_ACT_PUL is activated. The column operation may be performed normally in the core region 200 when the normal column command NM_RD/WT is activated after the core region 200 enters the active state.

Since the additional active command AD_ACT is activated at the beginning point of the "third section" and thus the state of the core region 200 is switched into the active state, it is detected whether or not the predetermined time SET_TIME passes after the moment when the additional active pulse AD_ACT_PUL is activated in the "third section" just as it was in the "second section", and based on the detection result, the additional precharge pulse AD_PCG_PUL is generated.

In the "third section", the normal precharge command NM_PCG is activated before the predetermined time SET_TIME passes after the moment when the additional active pulse AD_ACT_PUL is activated. Therefore, the additional precharge pulse AD_PCG_PUL is not activated and the state of the core region 200 is switched into the precharge state in response to the normal precharge command NM_PCG.

In the "fourth section", the normal column command NM_RD/WT is activated before the predetermined time SET_TIME passes after the moment when the normal active command NM_ACT is activated. Therefore, the additional precharge pulse AD_PCG_PUL is not activated and the core region 200 remains in the active state. While the core region 200 is maintained in the active state, the column operation of inputting/outputting data may be performed in the core region 200 in response to the normal column command NM_RD/WT.

Moreover, as described with reference to FIG. 2, a measurement signal ADET is used to determine whether or not the predetermined time passes after the moment when the normal active command NM_ACT or the additional active command AD_ACT is activated. That is, the number of times that the oscillation signal OSC toggles at a predetermined frequency is counted from the moment when the normal active command NM_ACT or the additional active command AD_ACT is activated, and the counted number is outputted as the measurement signal ADET. The determination is made based on whether a value of the measurement signal ADET is greater than the predetermined value. Therefore, a value of the measurement signal ADET is initialized when the normal active command NM_ACT or the normal column command NM_RD/WT is activated. Thus, a value of the measurement signal ADET is initialized at the moments when the "first section", the "second section", the "third section", and the "fourth section" begin.

The value of the measurement signal ADET is initialized based on the external column command EX_RD/WT, instead of being initialized based on the additional active pulse AD_ACT_PUL. The external column command EX_RD/WT is applied before the predetermined time SET_TIME passes after the core region 200 enters the active state as shown in the "fourth section", the core region 200 has to keep the active state continuously while initializing a value of the measurement signal ADET when the additional active pulse AD_ACT_PUL is not activated yet.

As described above, in the embodiments of the present invention, it may be possible to prevent the active state of the core region from lasting too long since the core region may detect whether or not the predetermined time SET_TIME passes after the moment when the core region enters the active state and based on the detection result, enters the precharge state.

In this manner, the amount of current wastefully consumed for maintaining the active state may be saved.

Additionally, an error in data input/output caused as the core region is maintained too long in the active state may be prevented.

In addition, since the core region may go back to the active state again in response to the external column command EX_RD/WT after the core region enters the precharge state by itself, its operation of entering the precharge state by itself may not be known outside. That is, when an external memory controller controls the semiconductor memory device, the controlling mechanism for controlling the semiconductor memory device in accordance with the embodiments of the present invention is completely the same as the controlling mechanism for controlling the conventional semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   an active state detector suitable for detecting whether or not a predetermined time passes after a moment when a normal active command or an additional active pulse is activated in an active state detection mode, and generating an additional precharge pulse based on a detection result;
   a column controller suitable for generating the additional active pulse based on the additional precharge pulse, a column address, and an external column command in the active state detection mode; and
   a core region suitable for being activated based on the normal active command or an additional active command corresponding to the additional active pulse, and being precharged based on an additional precharge command corresponding to the additional precharge pulse or a normal precharge command.

2. The semiconductor memory device of claim 1, further comprising:
   a first active controller suitable for generating the normal active command based on an external active command and a row address, and generating the normal precharge command based on an external precharge command and the row address; and
   a second active controller suitable for generating the additional active command based on the additional active pulse and the row address, and generating the additional precharge command based on the additional precharge pulse and the row address.

3. The semiconductor memory device of claim 1, wherein the active state detector includes:
   an oscillation unit for generating an oscillation signal that toggles at a predetermined frequency in the active state detection mode;
   an active measurement unit for counting the number of times that the oscillation signal toggles after a moment when the normal active command or the additional active pulse is activated in the active state detection mode, and outputting the counted number as a measurement signal; and
   a pulse generation unit for selectively activating the additional precharge pulse when a value of the measurement signal is greater than a predetermined value.

4. The semiconductor memory device of claim 3, wherein the active measurement unit initializes a value of the measurement signal when the normal active command is activated or the external column command is applied, in the active state detection mode.

5. The semiconductor memory device of claim 4, wherein the pulse generation unit activates the additional precharge pulse, when a value of the measurement signal is greater than the predetermined value in the active state detection mode, and
the pulse generation unit does not activate the additional precharge pulse, when a value of the measurement signal is equal to or less than the predetermined value in the active state detection mode.

6. The semiconductor memory device of claim 5, wherein the column controller activates the additional active pulse when the external column command and the column address are applied when the additional precharge pulse is activated, and
the column controller does not activate the additional active pulse regardless of whether the external column command and the column address are applied when the additional precharge pulse is not activated.

7. The semiconductor memory device of claim 5, wherein the column controller activates a normal column command when the external column command and the column address are applied, regardless of the active state detection mode.

8. The semiconductor memory device of claim 7, wherein the column controller activates the normal column command when a predetermined time passes after a moment when the additional active pulse is activated when the external column command and the column address are applied, and the additional precharge pulse is activated.

9. The semiconductor memory device of claim 7, wherein the core region performs a column operation for inputting/outputting data based on the normal column command.

10. A method for operating a semiconductor memory device, comprising:
detecting whether or not a predetermined time passes after a moment when a normal active command is activated in an active state detection mode to produce a first detection result; and
internally generating an additional precharge pulse based on the first detection result.

11. The method of claim 10, further comprising:
generating an additional active pulse based on an external column command and a column address, when the additional precharge pulse is activated;
detecting whether or not the predetermined time passes after a moment when the additional active pulse is activated to produce a second detection result, and generating the additional precharge pulse based on the second detection result;
generating the additional active pulse based on the external column command and the column address, when the additional precharge pulse is activated; and
activating a core region based on the normal active command or an additional active command corresponding to the additional active pulse, and precharging the core region based on a normal precharge command or an additional precharge command corresponding to the additional precharge pulse.

12. The method of claim 11, further comprising:
generating the normal active command based on an external active command and a row address;
generating the normal precharge command based on an external precharge command and the row address;
generating the additional active command based on the additional active pulse and the row address; and
generating the additional precharge command based on the additional precharge pulse and the row address.

13. The method of claim 11, further comprising:
generating an oscillation signal that toggles at a predetermined frequency in the active state detection mode.

14. The method of claim 12, wherein the detecting of whether or not the predetermined time passes to produce the first detection result includes:
counting the number of times that the oscillation signal toggles after the moment when the normal active command is activated in the active state detection mode, and outputting the counted number as a measurement signal.

15. The method of claim 14, wherein the internally generating of the additional precharge pulse includes:
selectively activating the additional precharge pulse when a value of the measurement signal is greater than a predetermined value.

16. The method of claim 15, wherein the generating of the additional active pulse includes:
activating the additional active pulse based on the external column command and the column address, when the additional precharge pulse is activated; and
not activating the additional active pulse regardless of the external column command and the column address, when the additional precharge pulse is not activated.

17. The method of claim 16, wherein the detecting of whether or not the predetermined time passes to produce the second detection result includes:
counting the number of times that the oscillation signal toggles after the moment when the additional active pulse is activated and outputting the counted number as the measurement signal; and
selectively activating the additional precharge pulse when a value of the measurement signal is greater than a predetermined value.

18. The method of claim 17, wherein the generating of the additional active pulse includes:
activating the additional active pulse based on the external column command and the column address, when the additional precharge pulse is activated; and
not activating the additional active pulse regardless of the external column command and the column address, when the additional precharge pulse is not activated.

19. The method of claim 18, wherein the value of the measurement signal is initialized when the normal active command is activated or the external column command is applied, in the active state detection mode.

20. The method of claim 19, further comprising:
generating a normal column command based on the external column command and the column address, regardless of the active state detection mode.

* * * * *